United States Patent
Theertham et al.

(10) Patent No.: US 11,290,118 B2
(45) Date of Patent: Mar. 29, 2022

(54) FREQUENCY SYNTHESIZER

(71) Applicant: TEXAS INSTRUMENTS INCORPORATED, Dallas, TX (US)

(72) Inventors: Srinivas Theertham, Bengaluru (IN); Jagdish Chand, Bengaluru (IN); Yogesh Darwhekar, Bengaluru (IN); Subhashish Mukherjee, Bengaluru (IN); Jayawardan Janardhanan, Bengaluru (IN); Uday Kiran Meda, Hyderabad (IN); Arpan Sureshbhai Thakkar, Vadodara (IN); Apoorva Bhatia, Lucknow (IN); Pranav Kumar, Hatia (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 17/128,791

(22) Filed: Dec. 21, 2020

(65) Prior Publication Data

US 2021/0391866 A1    Dec. 16, 2021

(30) Foreign Application Priority Data

Jun. 11, 2020   (IN) .............................. 202041024507

(51) Int. Cl.
*H03L 7/23* (2006.01)
*H03M 1/66* (2006.01)
*H03L 7/085* (2006.01)
*H03L 7/099* (2006.01)

(52) U.S. Cl.
CPC .............. *H03L 7/235* (2013.01); *H03L 7/085* (2013.01); *H03L 7/099* (2013.01); *H03M 1/66* (2013.01)

(58) Field of Classification Search
CPC ....... H03L 7/085; H03L 7/099; H03L 7/0991; H03L 7/0992; H03L 7/22; H03L 7/23; H03L 7/235
See application file for complete search history.

(56) References Cited

U.S. PATENT DOCUMENTS

| | | | |
|---|---|---|---|
| 6,731,712 B1* | 5/2004 | Lindstrom | H03J 1/005 327/156 |
| 2005/0046491 A1* | 3/2005 | Smith | H03L 7/1976 331/25 |
| 2006/0226916 A1* | 10/2006 | Florescu | H03L 7/103 331/16 |
| 2013/0342256 A1* | 12/2013 | Wadhwa | H03K 5/133 327/277 |
| 2019/0052278 A1* | 2/2019 | Pandita | G06F 1/08 |

* cited by examiner

*Primary Examiner* — Diana J. Cheng
(74) *Attorney, Agent, or Firm* — John R. Pessetto; Charles A. Brill; Frank D Cimino

(57) ABSTRACT

A frequency synthesizer includes a phase-locked loop (PLL). The PLL includes a first voltage-controlled oscillator (VCO) and a second VCO, each comprising an oscillator, a capacitor bank, and a bias circuit. The capacitor bank is configured to selectably adjust an output frequency of the oscillator. The bias circuit is configured to provide a bias current to the oscillator, and includes a current digital-to-analog converter (IDAC), and an amplifier coupled to the IDAC and configured to drive the oscillator.

16 Claims, 6 Drawing Sheets

| NO | NDIV (FREQ) | DBLR_PATH | CAP CODE | IDAC | VCO NO |
|---|---|---|---|---|---|
| 1 | NDIV1 (5500MHz) | 1 | 15 | 3 | 1 |
| 2 | NDIV2 (~5510MHz) | 1 | 14 | 3 | 1 |
| ooo | ooo | ooo | ooo | ooo | ooo |
| 256 | NDIV256(~8000MHz) | 1 | 0 | 0 | 3 |
| 257 | NDIV256(~8010MHz) | 2 | 15 | 3 | 4 |
| ooo | ooo | ooo | ooo | ooo | ooo |
| 512 | 2*NDIV1 (11000MHz) | 2 | 0 | 0 | 7 |

INTERNAL RAM 602, 610, 606, 608, 604

FREQUENCY SYNTHESIZER

This application claims priority to India Provisional Application 202041024507, filed Jun. 11, 2020, titled "Fast Frequency Switching Scheme Using RF Synthesizers," which is hereby incorporated by reference in its entirety.

BACKGROUND

Frequency synthesizers are used to drive, synchronize the operation of, and provide reference signals in a wide variety of electronic circuits. For example, frequency synthesizers are used to generate dock signals in networks, computers and video displays and enable modulation and demodulation in wireless communication devices. As operating frequencies of these circuits have increased over time, the demands on the output signals that frequency synthesizers generate have also increased. Frequency synthesizers should be capable of generating a high (e.g., megahertz or gigahertz-range) frequency output signal, and should do so with a minimum of phase noise, frequency jitter, drift, temperature, or age-dependent amplitude or frequency degradation.

SUMMARY

Frequency synthesizers that provide fast frequency switching and a high level of signal purity are disclosed herein. In one example, a frequency synthesizer includes a phase-locked loop (PLL). The PLL includes an oscillator control circuit and a voltage-controlled oscillator (VCO). The oscillator control circuit includes a capacitor control terminal and a current control terminal. The VCO includes an oscillator, a capacitor bank, and a bias circuit. The oscillator includes a capacitor terminal and a bias current terminal. The capacitor bank includes an oscillator terminal coupled to the capacitor terminal, and a selection terminal coupled to the capacitor control terminal. The bias circuit includes a current digital-to-analog converter (IDAC), a filter capacitor terminal, and an amplifier. The IDAC includes an input terminal coupled to the current control terminal, and an output terminal. The amplifier includes an input terminal coupled to the output terminal of the IDAC, and an output terminal coupled to the filter capacitor terminal and the bias current terminal.

In another example, a frequency synthesizer includes a PLL. The PLL includes a first VCO and a second VCO, each comprising an oscillator, a capacitor bank, and a bias circuit. The capacitor bank is configured to selectably adjust an output frequency of the oscillator. The bias circuit is configured to provide a bias current to the oscillator, and includes an IDAC, and an amplifier coupled to the IDAC and configured to drive the oscillator.

In a further example, a frequency synthesizer includes a first PLL and a second PLL, each including a first VCO, a second VCO, a calibration look-up table, a calibration circuit, and an oscillator control circuit. Each of the first VCO and the second VCO includes an oscillator, a capacitor bank, and a bias circuit. The capacitor bank is configured to selectably adjust an output frequency of the oscillator. The bias circuit is configured to provide a bias current to the oscillator, and includes an IDAC, and an amplifier coupled to the IDAC and configured to drive the oscillator. The calibration look-up table is configured to store a VCO selection, a capacitor selection, and bias current selection for each of multiple frequencies. The calibration circuit is configured to initialize the look-up table. The oscillator control circuit is configured to apply the VCO selection, the capacitor selection, and the bias current selection stored in the calibration look-up table for a given frequency to set the oscillator to produce the given frequency.

BRIEF DESCRIPTION OF THE DRAWINGS

For a detailed description of various examples, reference will now be made to the accompanying drawings in which:

FIG. 6 shows an example calibration look-up table suitable for use in a PLL as described herein.

DETAILED DESCRIPTION

Frequency switching speed, the time needed for a frequency synthesizer to switch from one frequency to another, is a key parameter for many applications. To change frequencies, a synthesizer must go through several steps before reaching the new frequency, including the blanking time when the output power is attenuated between the frequencies to minimize spurious generation, the dwell time, and the settling time. Direct digital synthesis (DDS) systems provide high frequency switching speed (e.g., microsecond switching speed), but signal quality and bandwidth are limited. For example, DDS systems are impractical when frequencies above 10 gigahertz are needed. DDS systems are complex, with large amounts of memory, digital signal processors, and filter banks to attenuate digital-to-analog converter clock components.

Phase-locked loop (PLL) based frequency synthesizers provide low phase noise, accurate amplitude, and high dynamic range. However, PLLs include dividers and filters that limit frequency switching speed. For example, when switching frequencies in a PLL, calibration of output amplitude may require 50 microseconds (us) or more, due to the time needed to charge bias current filter capacitance.

The frequency synthesizers disclosed herein apply PLLs to provide high signal purity with a frequency switching time of less than 1 us. The PLLs include a variety of features that reduce switching time. The PLLs include open collector outputs that allow ping-ponging between the PLLs. The PLLs also include a calibration look-up table that stores the various parameters applied to configure the PLL to generate a desired output frequency. The calibration look-up table is loaded at initialization of the frequency synthesizer. The voltage controlled oscillator (VCO) bias circuitry of the PLLs includes an amplifier to reduce the time needed to charge the external bias current filter capacitance.

Figure 1:
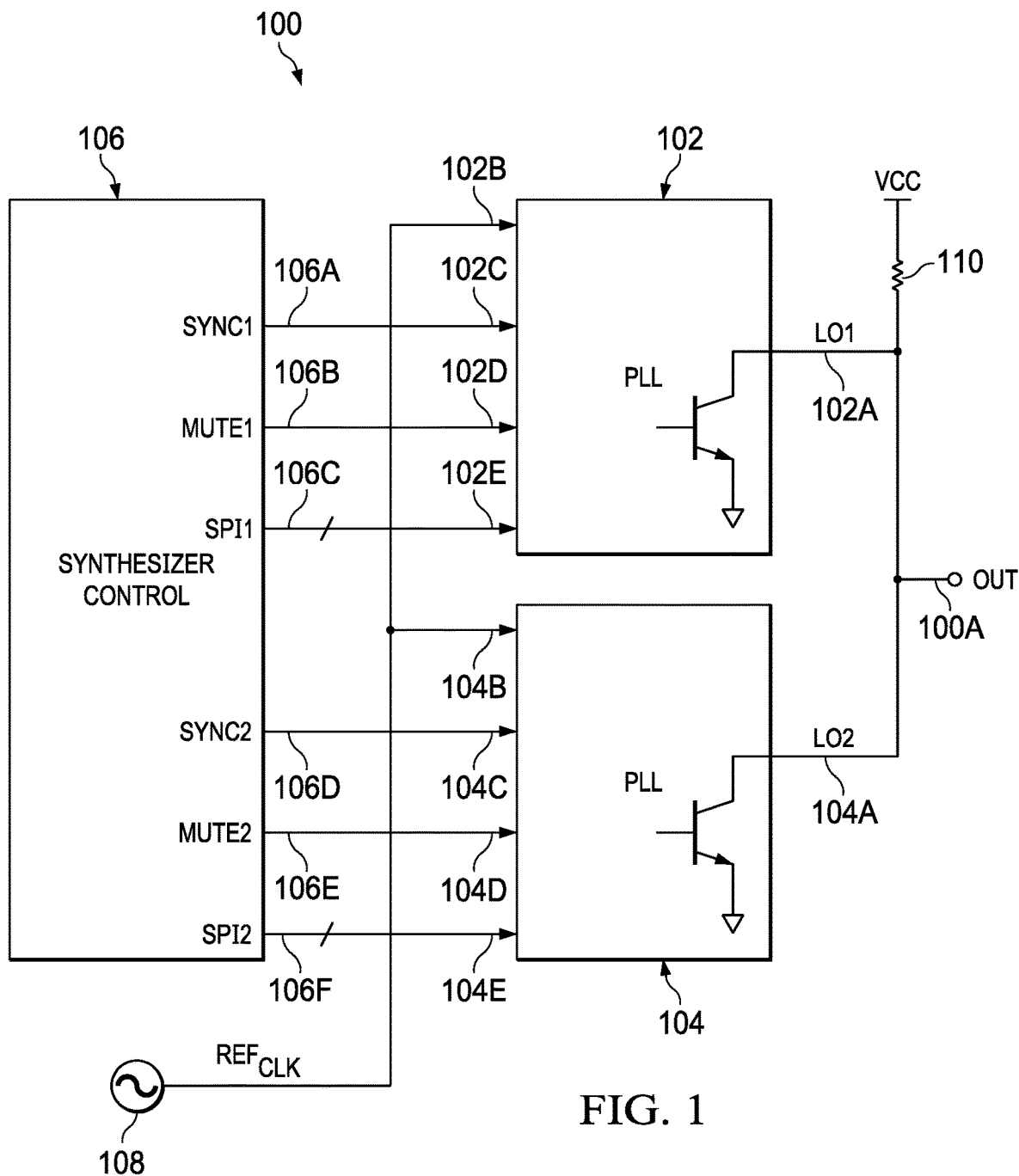
FIG. 1 shows a block diagram for an example frequency synthesizer as described herein.

FIG. 1 shows a block diagram for an example PLL-based frequency synthesizer 100 that provides fast frequency switching. The frequency synthesizer 100 includes a PLL 102, a PLL 104, and a synthesizer control circuit 106. Some implementations of the frequency synthesizer 100 include more than two PLLs. The PLL 102 includes an output 102A. The PLL 104 includes an output 104A. The output 102A of the PLL 102 and the output 104A of the PLL 104 are coupled to the output 100A of the frequency synthesizer 100. The output 102A and the output 104A are open-collector outputs. A resistor 110 pulls up the signal at the output 100A.

The PLL 102 includes a reference input 102B, and the PLL 104 includes a reference input 104B. The reference input 102B of the PLL 102 and the reference input 104B of the PLL 104 are coupled to a reference signal source 108 for receipt of a reference frequency to be compared to a divided output frequency of the PLL.

The synthesizer control circuit 106 is coupled to the PLL 102 and the PLL 104. The synthesizer control circuit 106 controls the PLL 102 and the PLL 104. The synthesizer control circuit 106 sets the PLL 102 to generates a first frequency, and sets the PLL 104 to generate a second frequency. To provide the first frequency at the output 100A, the synthesizer control circuit 106 enables the output 102A of the PLL 102 and disables (places in a high-impedance state) the output 104A of the PLL 104. To change the frequency at the output 100A to the second frequency, the synthesizer control circuit 106 disables the output 102A of the PLL 102 and enables the output 104A of the PLL 104.

The synthesizer control circuit 106 includes a mute output 106B coupled to a mute terminal 102D of the PLL 102, and a mute output 106E coupled to a mute terminal 104D of the PLL 104. The synthesizer control circuit 106 activates a mute signal at the mute output 106B to disable the output 102A, and deactivates the mute signal at the mute output 106B to enable the output 102A. Similarly, the synthesizer control circuit 106 activates a mute signal at the mute output 106E to disable the output 104A, and deactivates the mute signal at the mute output 106E to enable the output 104A. Use of the mute terminals 102D, 104D to ping-pong between the PLL 102 and the PLL 104 allows the frequency synthesizer 100 to provide sub-us frequency switches.

The synthesizer control circuit 106 includes a communication port 106C coupled to a communication port 102E of the PLL 102, and a communication port 106F coupled to a communication port 104E of the PLL 104. The synthesizer control circuit 106 provides configuration information (e.g., to set the frequency generated by the PLL 102 and the PLL 104) to the PLL 102 and the PLL 104 via the communication port 106C and the communication port 106F respectively.

Some implementations of the synthesizer control circuit 106 include a synchronization output 106A coupled to a synchronization input 102C of the PLL 102, and a synchronization output 106D coupled to a synchronization input 104C of the PLL 104. The synthesizer control circuit 106 activates a synchronization signal at the synchronization output 106A to synchronize the frequency generated by the PLL 102. Similarly, the synthesizer control circuit 106 activates a synchronization signal at the synchronization output 106D to synchronize the frequency generated by the PLL 104.

Figure 2:
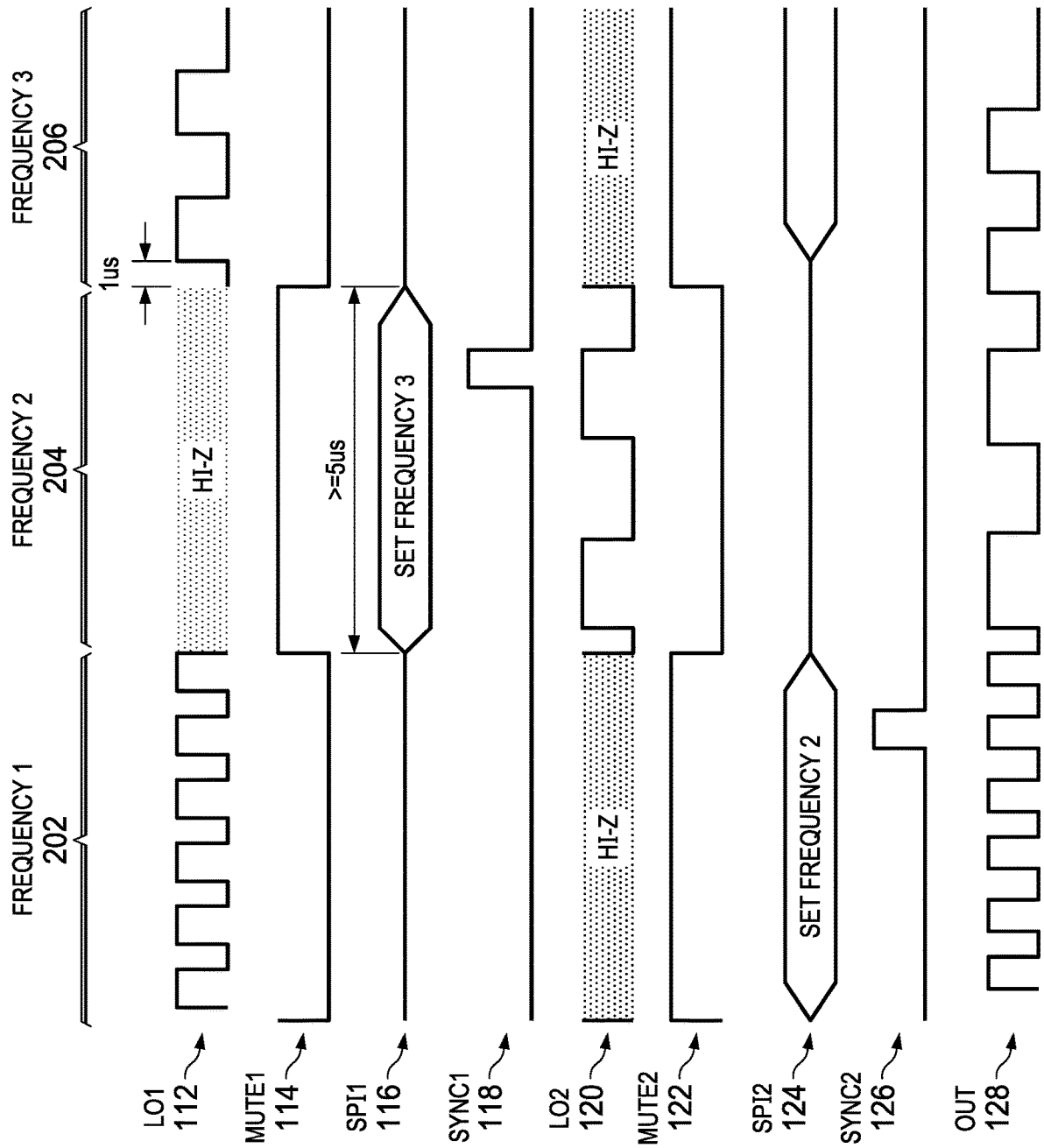
FIG. 2 shows example signals generated in a frequency synthesizer as described herein.

FIG. 2 shows example signals generated in the frequency synthesizer 100. In the interval 202, the synthesizer control circuit 106 deactivates the mute signal 114 at the mute terminal 102D of the PLL 102 and activates the mute signal 122 at the mute terminal 104D of the PLL 104. The output 104A of the PLL 104 is in a high-impedance state as shown in the signal 120, and the PLL 102 provides frequency 1 (in the signal 112) at the output 102A of the PLL 102. Frequency 1 is provided at the output 100A of the frequency synthesizer 100 in signal 128. The synthesizer control circuit 106 provides frequency 2 parameters to the PLL 104 via the signal 124.

In the interval 204, the synthesizer control circuit 106 deactivates the mute signal 122 and activates the mute signal 114. The output 102A of the PLL 102 is in a high-impedance state as shown in the signal 112, and the PLL 104 provides frequency 2 (in the signal 120) at the output 104A. Frequency 2 is provided at the output 100A of the frequency synthesizer 100 in the signal 128. The synthesizer control circuit 106 provides frequency 3 parameters to the PLL 102 via the signal 116.

In the interval 206, the synthesizer control circuit 106 deactivates the mute signal 114 and activates the mute signal 122. The output 104A of the PLL 104 is in a high-impedance state as shown in the signal 120, and the PLL 102 provides frequency 3 (in the signal 112) at the output 102A. Frequency 3 is provided at the output 100A of the frequency synthesizer 100 in the signal 128. Thus, by use of output muting and reprogramming while muted, the frequency synthesizer 100, switches from frequency 1 to frequency 2, or from frequency 2 to frequency 3 in 1 us or less.

Figure 3:
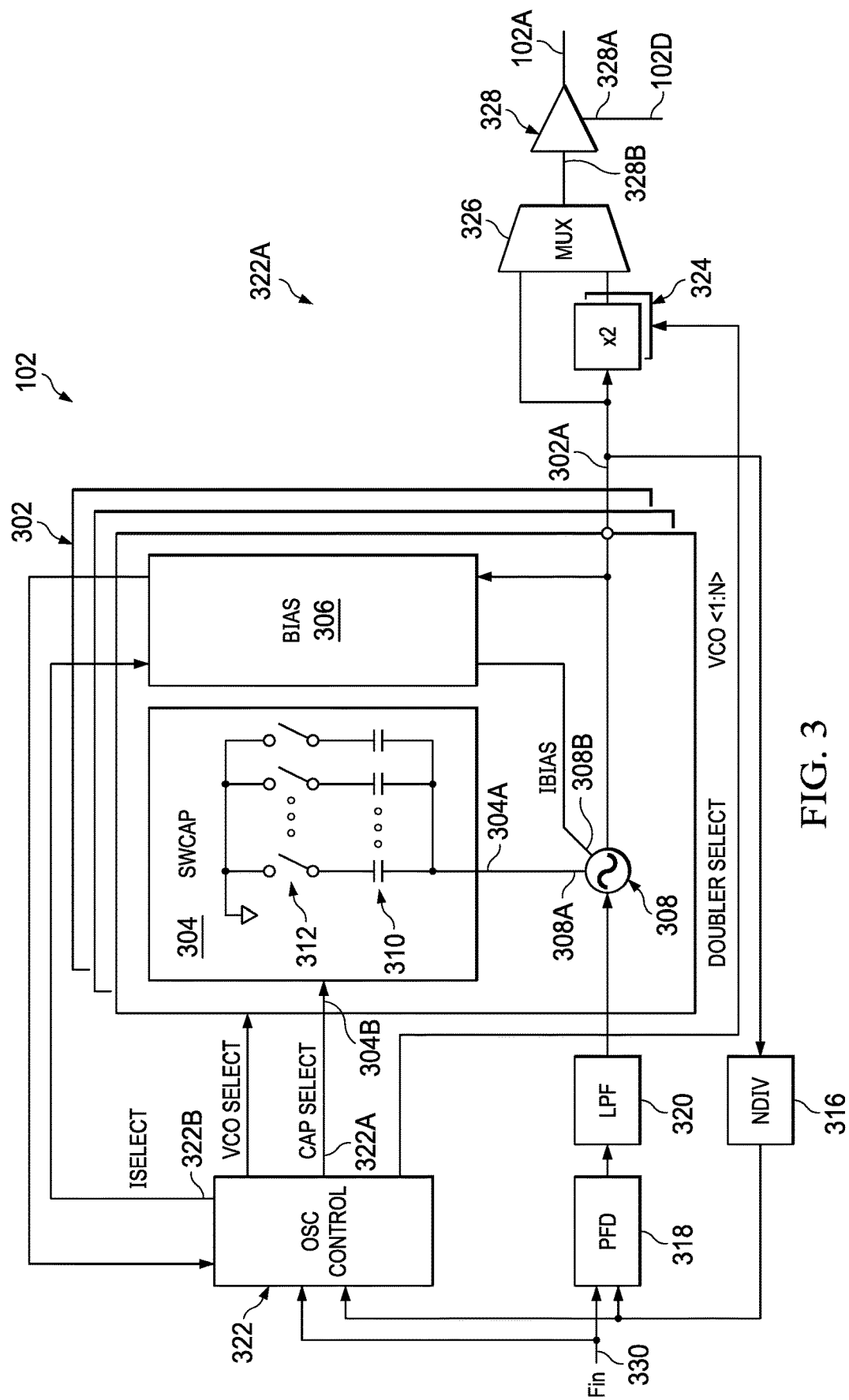
FIG. 3 shows a block diagram for an example phase-locked loop (PLL) suitable for use in a frequency synthesizer as described herein.

FIG. 3 shows a block diagram for an example PLL 102 suitable for use in an implementation of the frequency synthesizer 100. The PLL 102 includes multiple VCOs 302, a frequency divider circuit 316, a phase-frequency detector circuit 318, a low-pass filter circuit 320, an oscillator control circuit 322, one or more frequency doubler circuit 324, a multiplexer 326, and an output buffer circuit 328. Each VCO 302 (VCO circuit) includes an oscillator 308 (e.g., an L-C oscillator circuit), a capacitor bank 304 and a bias circuit 306 coupled to the oscillator 308. The capacitor bank 304 includes capacitors 310 and switches 312. The switches 312 are closed to select the capacitors 310 applied to the oscillator 308 for output frequency generation and adjustment. An oscillator terminal 304A of the capacitor bank 304 is coupled to a capacitor terminal 308A of the oscillator 308. The bias circuit 306 generates and provides a bias current to the oscillator 308 for frequency generation. The oscillator control circuit 322 generates a VCO select signal to select a VCO 302 to generate a desired frequency, generates a capacitor select signal to selects one or more of the capacitors 310 to apply to the oscillator 308 by closing or opening the switches 312, and generates a current select signal to control generation of a bias current in the bias circuit 306 for biasing the oscillator 308. The oscillator control circuit 322 includes a capacitor control terminal 322A coupled to a selection terminal 304B of the capacitor bank 304, and a current control terminal 322B coupled to the bias circuit 306.

The output terminal 302A of the VCO 302 is coupled to the frequency divider circuit 316. The frequency divider circuit 316 includes circuitry (e.g., counters) that divide the output frequency of the VCO 302 for comparison to a reference frequency 330. The frequency divider circuit 316 provides the divided VCO output frequency to the phase-frequency detector circuit 318. The phase-frequency detector circuit 318 compares the frequency and/or phase of the divided VCO output frequency to the reference frequency 330 to generate a signal representative of the difference in phase/frequency of the two compared signals. The low-pass filter circuit 320 low-pass filters the signal generated by the phase-frequency detector circuit 318. The low-pass filtered signal drives the oscillator 308 to synchronize the divided VCO output to the reference frequency 330.

The output terminal 302A of the VCO 302 is also coupled to the frequency doubler circuit 324 and the multiplexer 326. The frequency doubler circuit 324 includes circuitry that doubles the frequency output by the VCO 302. The frequency doubler circuit 324 is coupled to the multiplexer 326.

The multiplexer 326 selects the frequency output by the VCO 302, or the frequency output by the frequency doubler circuit 324 to provide to the output buffer circuit 328. The output buffer circuit 328 is an open-collector or open-drain driver circuit that drives an output signal of the VCO 302. The output buffer circuit 328 includes an input terminal 328B coupled to the multiplexer 326, and an enable terminal 328A coupled to the mute terminal 102D. The output 328C of the output buffer circuit 328 is coupled to the output 102A. The output 328C of the output buffer circuit 328 is placed in a high-impedance state when the mute signal at the enable terminal 328A is active.

Figure 4:
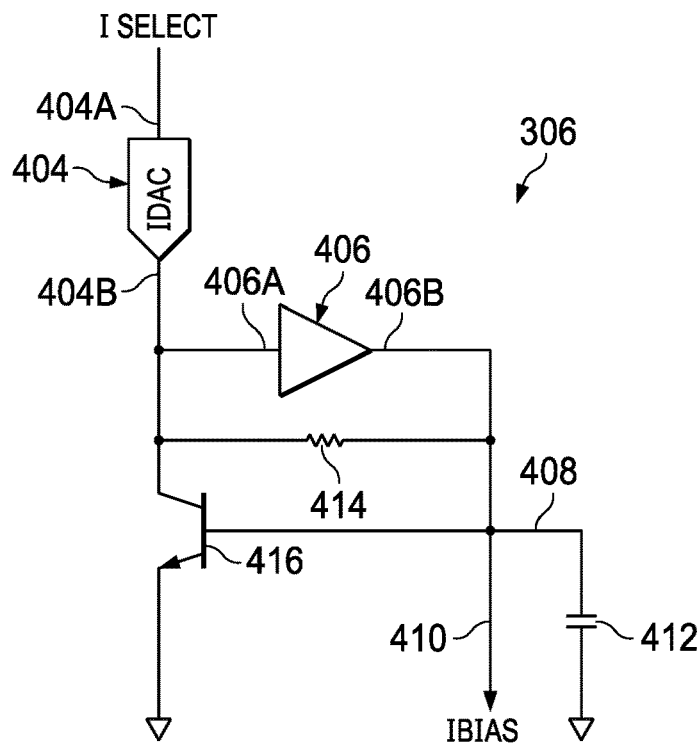
FIG. 4 shows a schematic level diagram for an example bias current amplifier circuit as described herein.

The oscillator control circuit 322 controls the VCO 302, the frequency doubler circuit 324, and other circuits of the PLL 102. The oscillator control circuit 322 selects one of the VCOs 302 to best generate a desired output frequency, selects the capacitors 310 to apply in the VCO 302, and selects the bias current to be provided by the bias circuit 306. FIG. 4 shows a schematic level diagram for an example bias circuit 306. The bias circuit 306 includes a current digital-to-analog converter (IDAC) 404, an amplifier 406, an external capacitor terminal 408, a bias current terminal 410, a resistor 414, and a transistor 416. The IDAC 404 includes an input terminal 404A and an output terminal 404B. The input terminal 404A is coupled to the current control terminal 322B of the oscillator control circuit 322. The output terminal 404B is coupled to the input terminal 406A of the amplifier 406. The output terminal 406B of the amplifier 406 is coupled to the bias current terminal 410 and the external capacitor terminal 408 (filter capacitor terminal). A capacitor 412 is coupled to the external capacitor terminal 408. The resistor 414 is coupled to the input terminal 406A and the output terminal 406B of the amplifier 406. The transistor 416 is coupled to the output terminal 404B of the DAC 404 and the bias current terminal 410. The bias current terminal 410 is coupled to the bias current terminal 308B of the oscillator 308. The amplifier 406 increases the current sourced to charge the capacitor 412, thereby decreasing the time needed to charge the capacitor 412, and reducing the time to change frequencies in the PLL 102.

Figure 5:
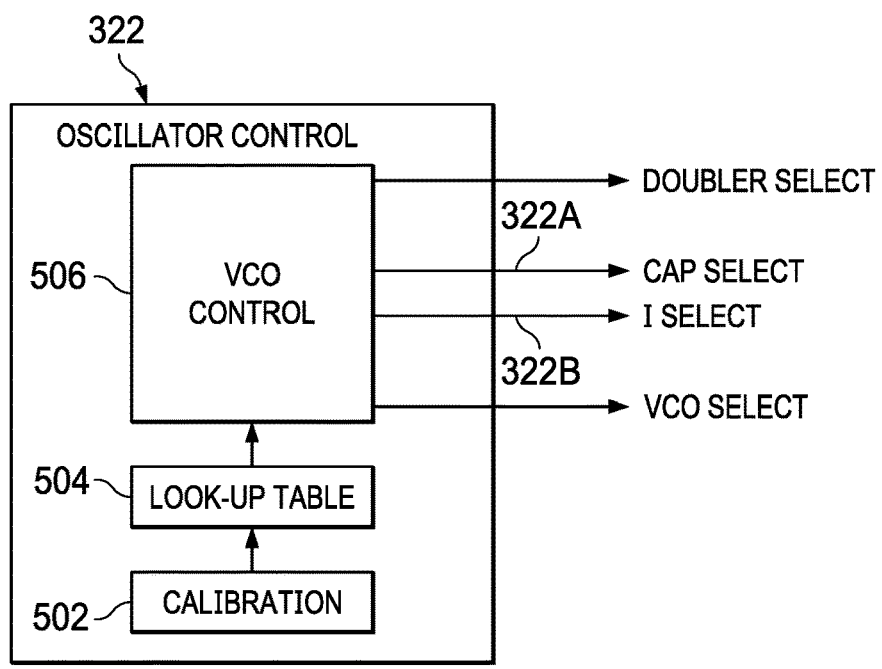
FIG. 5 shows a block diagram for an example oscillator control circuit suitable for use in a PLL as described herein.

FIG. 5 shows a block diagram for an example oscillator control circuit 322 suitable for use in the PLL 102. To reduce the time needed to change frequencies in the PLL 102, the oscillator control circuit 322 predetermines various parameters of the PLL 102 to be applied to generate multiple frequencies. For a desired frequency, the oscillator control circuit 322 applies the prestored parameters to determine which of the VCOs 302 to apply, to determine which of the capacitors 310 to apply, to set the bias current generated by the bias circuit 306, and to determine which of the frequency doubler circuits 324 to apply. The oscillator control circuit 322 includes a calibration circuit 502, a calibration look-up table 504, a PLL control circuit 506. The calibration circuit 502 loads the calibration look-up table 504 at initialization of the PLL 102. That is, for each of a plurality of frequencies to be generated by the PLL 102, the calibration circuit 502 determines which of the VCOs 302 to apply, determines which of the capacitors 310 to apply, determines the bias current to be generated by the bias circuit 306, and determines which of the frequency doubler circuits 324 to apply to best generate the frequency. The calibration circuit 502 stores, in the calibration look-up table 504, an identifier for each parameter (VCO, capacitor, bias current, frequency doubler) in a location associated with the frequency. Some implementations of the calibration circuit 502 include state machine circuitry that performs the calibration functions described above, including, for each of a plurality of frequencies to be generated by the PLL 102, determining which of the VCOs 302 to apply, which of the capacitors 310 to apply, what bias current to be generated by the bias circuit 306, which of the frequency doubler circuits 324 to apply to best generate the frequency, and loading the identified parameters into the calibration look-up table 504.

FIG. 6 shows an example calibration look-up table 504 suitable for use in the PLL 102. The calibration look-up table 504 includes storage for parameters applied to generate multiple frequencies (512 frequencies in FIG. 6, some implementations provide storage for a different number of frequencies) in the PLL 102. For each frequency, the calibration look-up table 504 includes a divider value 602, a VCO identifier 604, a capacitance code 606, a bias current code 608, and a doubler identifier 610. The divider value 602 is loaded into the frequency divider circuit 316. The VCO identifier 604 selects the VCO 302 to generate the frequency. For example, each VCO 302 is assigned an index value, and the VCO identifier 604 specifies the index value of the selected VCO 302. The capacitance code 606 is applied to select the capacitors 310 to the oscillator 308 for the frequency. For example, the capacitance code 606 is a value specifying the switches 312 to be closed in some implementations of the calibration look-up table 504. The bias current code 608 is applied to generate the bias current applied to the oscillator 308 for the frequency. For example, the bias current code 608 is a value to be loaded into the IDAC 404 in some implementations of the calibration look-up table 504. The doubler identifier 610 is applied to select the frequency doubler circuit 324 used to generate the frequency. For example, each frequency doubler circuit 324 is assigned an index value, and the doubler identifier 610 specifies the index value of the selected frequency doubler circuit 324.

Returning again to FIG. 5, the PLL control circuit 506 reads the parameters stored in the calibration look-up table 504 to set the PLL 104 to generate a desired frequency. When the frequency of the PLL 102 is to be changed, the PLL control circuit 506 accesses the location of the calibration look-up table 504 associated with a frequency closest to the frequency (a coarse frequency), and applies the information to set the PLL 102 to generate the frequency. That is, the PLL control circuit 506, applies the information associated with the frequency to set the frequency divider circuit 316, select the VCO 302, select the capacitors 310, set the bias current, and select the frequency doubler circuit 324. Because the parameters applied to generate the frequency are predetermined at initialization, the PLL control circuit 506 need not search for the best values of the parameters at run time, and the time needed to change the frequency is greatly reduced.

The PLL 102 is not limited to the frequencies defined in the calibration look-up table 504, but applies the parameters for a frequency defined in the calibration look-up table 504 to produce a frequency close to a desired frequency (e.g., a frequency not defined in the calibration look-up table 504), and thereafter adjusts the frequency of the oscillator 308 to obtain the desired frequency. The oscillator 308 includes a varactor (a voltage controlled variable capacitor). The capacitance of the varactor is variable to adjust the frequency of the oscillator 308 in a predetermined range (e.g., 100 megahertz) in some implementations. Having obtained the frequency close to the desired frequency based on the parameters stored in the calibration look-up table 504, the PLL control circuit 506 sets the frequency divider circuit 316 to divide the output of the oscillator 308 (at the desired frequency) to the reference frequency 330, and the output of the low-pass filter circuit 320 adjusts the capacitance of the varactor 332 to produce the desired frequency.

Figure 7:
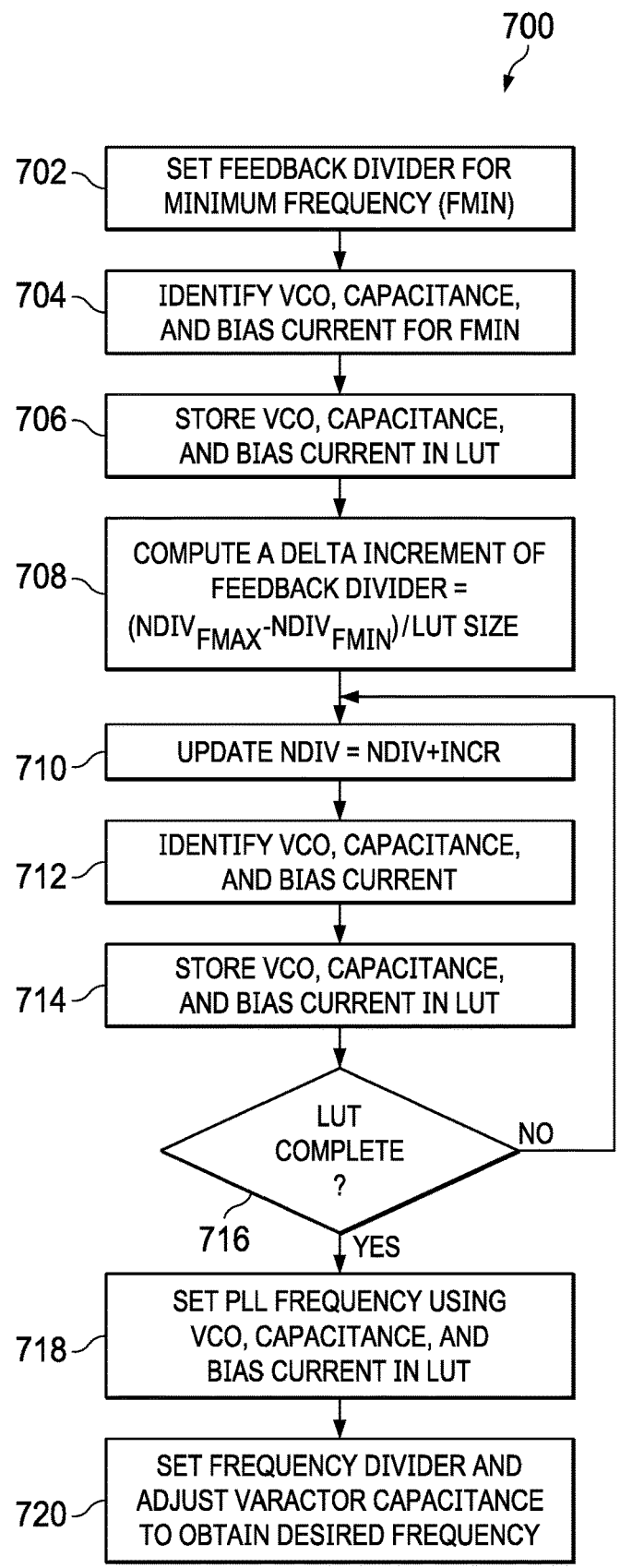
FIG. 7 shows a flow diagram for an example method for initializing a calibration look-up table as described herein.

FIG. 7 shows a flow diagram for an example method 700 for initializing the calibration look-up table 504. Though depicted sequentially as a matter of convenience, at least some of the actions shown can be performed in a different order and/or performed in parallel. Additionally, some implementations may perform only some of the actions shown. The method 700 is performed by an implementation of the calibration circuit 502 to load the calibration look-up table 504.

In block 702, the frequency divider circuit 316 is set to generate a minimum frequency of the PLL 102. The divider value for the minimum frequency is loaded into a location of the calibration look-up table 504 corresponding to the minimum frequency.

In block 704, the calibration circuit 502 identifies the VCO 302, the capacitors 310, the bias current, and the frequency doubler circuit 324 to apply to best generate the frequency. For example, the calibration circuit 502 iteratively applies the different VCOs 302, different values of the capacitors 310, and different bias current values to obtain phase lock with the reference frequency 330.

In block 706, the calibration circuit 502 writes the identified values for the VCO 302, the capacitors 310, the bias current, and the doubler to the location of the calibration look-up table 504 associated with the frequency.

In block 708, the calibration circuit 502 determines a frequency increment value to be applied to generate a next frequency to be added to the calibration look-up table 504. For example, the frequency increment value is the range of divider values applied in the PLL 102 divided by the number of frequency locations of the calibration look-up table 504.

In block 710, the divider value for the next frequency to be stored in the calibration look-up table 504 is determined by adding the frequency increment value to the last stored divider value (e.g., the divider value of block 702).

In block 712, the calibration circuit 502 identifies the VCO 302, the capacitors 310, the bias current, and the frequency doubler circuit 324 to apply to best generate the frequency corresponding to the divider value generated in block 710. For example, the calibration circuit 502 iteratively applies the different VCOs 302, different values of the capacitors 310, and different bias current values to obtain phase lock with the reference frequency 330.

In block 714, the calibration circuit 502 writes the identified values for the VCO 302, the capacitors 310, the bias current, and the frequency doubler to the location of the calibration look-up table 504 associated with the frequency of block 712.

In block 716, the calibration circuit 502 determines whether the calibration look-up table 504 is complete. For example, the calibration circuit 502 determines whether the location of the calibration look-up table 504 corresponding to the divider value for the maximum frequency to be generated by the PLL 102 has been loaded. If the calibration look-up table 504 is not complete, then the calibration circuit 502 selects a next divider value in block 710.

If the calibration look-up table 504 is complete, then the PLL control circuit 506 accesses the calibration look-up table 504 to set the PLL 102 to generate a selected frequency in block 718. For example, the PLL control circuit 506 sets the frequency divider circuit 316, selects a VCO 302, selects the capacitors 310 to apply to the oscillator 308, selects the bias current to apply to the oscillator 308, and selects the frequency doubler circuit 324 using the parameter values stored in the calibration look-up table 504 for a frequency close to the selected frequency.

In block 720, the PLL control circuit 506 sets the frequency divider circuit 316 sets the frequency divider circuit 316 to divide the output of the oscillator 308 (at the selected frequency) to the frequency of the reference frequency 330, and the output of the low-pass filter circuit 320 adjusts the capacitance of the varactor 332 to produce the desired frequency.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A frequency synthesizer, comprising:
a phase-locked loop (PLL) comprising:
an oscillator control circuit comprising a capacitor control terminal and a current control terminal;
a voltage-controlled oscillator (VCO) circuit comprising:
an oscillator comprising a capacitor terminal and a bias current terminal;
a capacitor bank comprising
an oscillator terminal coupled to the capacitor terminal; and
a selection terminal coupled to the capacitor control terminal;
a bias circuit comprising:
a current digital-to-analog converter (IDAC) comprising:
an input terminal coupled to the current control terminal; and
an output terminal;
a filter capacitor terminal;
a bias current terminal; and
an amplifier comprising:
an input terminal coupled to the output terminal of the IDAC; and
an output terminal coupled to the filter capacitor terminal and the bias current terminal.

2. The frequency synthesizer of claim 1, wherein:
the VCO comprises an output terminal; and
the PLL further comprises:
a mute terminal;
an output buffer circuit comprising:
an enable terminal coupled to the mute terminal; and
an input terminal coupled to the output terminal of the VCO.

3. The frequency synthesizer of claim 1, wherein:
the VCO is a first VCO; and
the PLL comprises:
a second VCO;
a calibration look-up table; and
a calibration circuit configured to:
for each of a plurality of frequencies:

determine which of the first VCO or the second VCO to use to generate a selected frequency; and store an identifier of the first VCO or the second VCO at a location of the calibration look-up table associated with the selected frequency.

4. The frequency synthesizer of claim 3, wherein the calibration circuit is configured to:
select, for the selected frequency, a capacitor of the capacitor bank to use to generate the selected frequency; and
store an identifier of the capacitor at the location of the calibration look-up table associated with the selected frequency.

5. The frequency synthesizer of claim 3, wherein the calibration circuit is configured to:
select, for the selected frequency, a bias current to use to generate the selected frequency; and
store an identifier of the bias current at the location of the calibration look-up table associated with the selected frequency.

6. The frequency synthesizer of claim 3, wherein:
the PLL further comprises:
a first frequency doubler circuit coupled to the VCO circuit; and
a second frequency doubler circuit coupled to the VCO circuit; and
the calibration circuit is configured to:
select, for the selected frequency, the first frequency doubler circuit or the second frequency doubler circuit to use to generate the selected frequency; and
store an identifier of the first frequency doubler circuit or the second frequency doubler circuit at the location of the calibration look-up table associated with the selected frequency.

7. The frequency synthesizer of claim 3, wherein the oscillator control circuit is configured to apply information stored at the location of the calibration look-up table to set the PLL to generate the selected frequency.

8. The frequency synthesizer of claim 1, wherein:
the PLL is a first PLL; and
the frequency synthesizer comprises:
a second PLL; and
a synthesizer control circuit coupled to the first PLL and the second PLL, and configured to change an output frequency of the frequency synthesizer by enabling the second PLL and disabling the first PLL.

9. A frequency synthesizer, comprising:
a phase-locked loop (PLL), comprising:
a first voltage-controlled oscillator (VCO) and a second VCO, each comprising:
an oscillator;
a capacitor bank configured to selectably adjust an output frequency of the oscillator; and
a bias circuit configured to provide a bias current to the oscillator, and comprising:
a current digital-to-analog converter (IDAC); and
an amplifier coupled to the IDAC and configured to drive the oscillator;
wherein:
the PLL comprises:
a calibration look-up table; and
a calibration circuit configured to:
initialize the calibration look-up table for a plurality of frequencies; and
for each frequency of the plurality of frequencies:
determine which of the first VCO or the second VCO to use to generate the frequency; and
store an identifier of the first VCO or the second VCO at a location of the calibration look-up table associated with the frequency.

10. The frequency synthesizer of claim 9, wherein the calibration circuit is configured to:
select, for the frequency, a capacitor of the capacitor bank to use to generate the frequency; and
store an identifier of the capacitor at the location of the calibration look-up table associated with the frequency.

11. The frequency synthesizer of claim 9, wherein the calibration circuit is configured to:
select, for the frequency, a bias current to use to generate the frequency; and
store an identifier of the bias current at the location of the calibration look-up table associated with the frequency.

12. The frequency synthesizer of claim 9, wherein:
the PLL further comprises:
a first frequency doubler circuit configured to double the output frequency of the oscillator; and
a second frequency doubler circuit configured to double the output frequency of the oscillator; and
the calibration circuit is configured to:
select, for the frequency, the first frequency doubler circuit or the second frequency doubler circuit to use to generate the frequency; and
store an identifier of the first frequency doubler circuit or the second frequency doubler circuit at the location of the calibration look-up table associated with the frequency.

13. The frequency synthesizer of claim 9, further comprising an oscillator control circuit is configured to apply information stored at the location of the calibration look-up table to set the PLL to generate a selected frequency.

14. A frequency synthesizer, comprising:
a first phase-locked loop (PLL) and a second PLL, each comprising:
a first voltage-controlled oscillator (VCO) and a second VCO, each comprising:
an oscillator;
a capacitor bank configured to selectably adjust an output frequency of the oscillator; and
a bias circuit configured to provide a bias current to the oscillator, and comprising:
a current digital-to-analog converter (IDAC); and
an amplifier coupled to the IDAC and configured to drive the oscillator;
a calibration look-up table configured to store a VCO selection, a capacitor selection, and bias current selection for each of multiple frequencies; and
a calibration circuit configured to initialize the calibration look-up table; and
an oscillator control circuit configured to apply the VCO selection, the capacitor selection, and the bias current selection stored in the calibration look-up table for a given frequency to set the oscillator to produce the given frequency;
wherein the calibration circuit is configured to:
for the given frequency of the multiple frequencies:
determine which of the first VCO or the second VCO to use to generate the given frequency; and
store an identifier of the first VCO or the second VCO at a location of the calibration look-up table associated with the given frequency.

15. The frequency synthesizer of claim 14, wherein the calibration circuit is configured to:
- select, for the given frequency, a capacitor of the capacitor bank to use to generate the given frequency; and
- store an identifier of the capacitor at the location of the calibration look-up table associated with the given frequency.

16. The frequency synthesizer of claim 14, wherein the calibration circuit is configured to:
- select, for the given frequency, a bias current to use to generate the given frequency; and
- store an identifier of the bias current at the location of the calibration look-up table associated with the given frequency.

* * * * *